United States Patent
Khan et al.

(10) Patent No.: US 8,372,697 B2
(45) Date of Patent: Feb. 12, 2013

(54) DIGITAL OXIDE DEPOSITION OF $SIO_2$ LAYERS ON WAFERS

(75) Inventors: Asif Khan, Irmo, SC (US); Vinod Adivarahan, Columbia, SC (US)

(73) Assignee: University of South Carolina, Columbia, SC (US)

( * ) Notice: Subject to any disclaimer, the term of this patent is extended or adjusted under 35 U.S.C. 154(b) by 1575 days.

(21) Appl. No.: 11/800,712

(22) Filed: May 7, 2007

(65) Prior Publication Data
US 2013/0017689 A1    Jan. 17, 2013

Related U.S. Application Data

(60) Provisional application No. 60/798,540, filed on May 8, 2006.

(51) Int. Cl.
*H01L 21/20* (2006.01)
(52) U.S. Cl. .................. 438/141; 257/E21.407
(58) Field of Classification Search .............. None
See application file for complete search history.

(56) References Cited

U.S. PATENT DOCUMENTS

| | | | |
|---|---|---|---|
| 6,316,793 B1 | 11/2001 | Sheppard et al. | |
| 6,534,395 B2 * | 3/2003 | Werkhoven et al. | 438/627 |
| 6,690,042 B2 | 2/2004 | Khan et al. | |
| 6,764,888 B2 | 7/2004 | Khan et al. | |
| 6,960,537 B2 * | 11/2005 | Shero et al. | 438/775 |
| 6,998,322 B2 | 2/2006 | Das et al. | |
| 7,141,859 B2 | 11/2006 | DeBoer et al. | |
| 7,199,061 B2 | 4/2007 | Choi et al. | |

* cited by examiner

*Primary Examiner* — Seahvosh Nikmanesh
(74) *Attorney, Agent, or Firm* — Dority & Manning, P.A.

(57) ABSTRACT

Novel silicon dioxide and silicon nitride deposition methods are generally disclosed. In one embodiment, the method includes depositing silicon on the surface of a substrate having a temperature of between about 65° C. and about 350° C. The heated substrate is exposed to a silicon source that is substantially free from an oxidizing agent. The silicon on the surface is then oxidized with an oxygen source that is substantially free from a silicon source. As a result of oxidizing the silicon, a silicon oxide layer forms on the surface of the substrate. Alternatively, or in additionally, a nitrogen source can be provided to produce silicon nitride on the surface of the substrate.

26 Claims, 4 Drawing Sheets

(a)

(b)

DIGITAL OXIDE DEPOSITION OF SIO$_2$ LAYERS ON WAFERS

PRIORITY INFORMATION

The present application claims priority to U.S. Provisional Patent Application No. 60/798,540 filed on May 8, 2006, naming Asif Khan and Vinod Adivarahan as inventors, which is herein incorporated by reference in its entirety.

GOVERNMENT SUPPORT CLAUSE

The present invention was developed with funding from the Department of Defense under grant DASG600310010. The government retains certain rights in the invention.

BACKGROUND OF THE INVENTION

III-Nitride based heterojunction field effect transistors (HFETs) are rapidly emerging as the most promising solid-state high-power RF sources since their first demonstration in 1993. Very high power densities, 10-30 W/mm, which are close to the theoretical limits for this material systems, have been achieved in the past two years. One of the most critical issues limiting the performance of these devices at high RF power levels is the device degradation primarily caused by high gate leakage currents. Insulated gate HFETs (IGHFETs) with SiO$_2$ and Si$_3$N$_4$ gate dielectrics can potentially overcome this problem by reducing both the reverse and the forward gate leakage currents by several orders of magnitude. Such insulating gate devices have been reported with much superior stability at high RF power levels as compared to the conventional Schottky gate HFETs.

The insulated gate HFET design leads to a larger threshold voltage. While it has been shown that the RF gain and the knee, voltage for submicron gate IGHFETs are the same as those of submicron HFETs, the larger gate-channel separation in the IGHFETs results in stronger short-channel effects. The reduced gate capacitance further makes IGHFETs more vulnerable to the effects of parasitic circuit capacitances. Thus, the IGHFETs with threshold voltages close to HFETs are very desirable. Such devices can be achieved either by (i) reducing the silicon dioxide or silicon nitride thickness or (ii) by using the materials with higher dielectric permittivity.

The quality of the gate dielectric plays a crucial role in the insulated gate HFET device performance. The presence of interface and bulk charges in the dielectric film adversely affect the gate control by introducing threshold voltage and peak current dispersion. Most of the reported III-N IGHFETs used dielectric layers which are deposited using the Plasma Enhanced Chemical Vapor Deposition (PECVD) technique. This technique produces reasonable quality of dielectric layers when the thicknesses are in excess of 10 nm. However, the PECVD dielectric layers, for thickness less than 10 nm, show increased leakage currents, threshold voltage dispersion and poor reproducibility As such, a need exists to obtain low threshold IGHFETs with significantly reduced gate leakage currents by reducing the silicon dioxide or silicon nitride thickness.

SUMMARY OF THE INVENTION

Objects and advantages of the invention will be set forth in part in the following description, or may be obvious from the description, or may be learned through practice of the invention.

In general, the present disclosure is directed toward silicon oxide and silicon nitride deposition methods. In one embodiment, the method includes depositing silicon on the surface of a substrate having a temperature of between about 65° C. and about 350° C. The heated substrate is exposed to a silicon source that is substantially free from an oxidizing agent (e.g., less than about 0.1% by weight, including completely free). The silicon on the surface is then oxidized with an oxygen source that is substantially free from a silicon source (e.g., less than about 0.1% by weight, including completely free). As a result of oxidizing the silicon, a silicon oxide layer forms on the surface of the substrate. Alternatively, or in additionally, a nitrogen source can be provided to produce silicon nitride on the surface of the substrate.

Other features and aspects of the present invention are discussed in greater detail below.

BRIEF DESCRIPTION OF FIGURES

A full and enabling disclosure of the present invention, including the best mode thereof to one skilled in the art, is set forth more particularly in the remainder of the specification, which includes reference to the accompanying figures, in which.

DETAILED DESCRIPTION OF PREFERRED EMBODIMENTS

Figure 1:
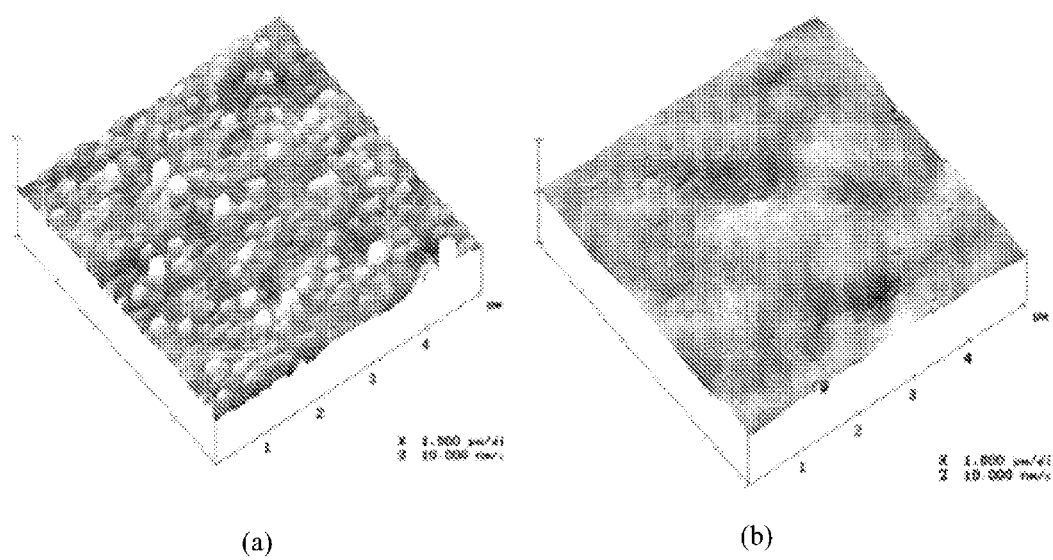
FIG. 1 shows AFM images of PECVD deposited SiO$_2$ layers under different methods: (a) conventional deposition, and (b) digital oxide deposition.

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

In general, the present disclosure is directed to a novel Digital Oxide Deposition (DOD) technique for depositing a silicon oxide, silicon nitride, or silicon oxynitride layer(s) on a substrate. In the DOD process, silicon and oxygen precursor sources are alternatively supplied to the PECVD growth chamber. As a result, the silicon atoms surface mobility is increased allowing for a complete reaction with oxygen, thus providing the basis for superior atomic layer epitaxy. The DOD technique also suppresses unnecessary gas phase reactions due to the alternate supply of the precursors. As such, the DOD approach can avoid some issues arising in very thin PECVD deposited silicon dioxide layers.

As stated, the silicon oxide deposition process of the present invention generally involves alternating the application of silicon and oxygen to the substrate in a PECVD growth chamber to form a silicon dioxide dielectric layer. Accordingly, the silicon source and the oxygen source are applied independently from each other. For example, the substrate is first exposed to the silicon source gas, without any oxygen source present. Following purging of the silicon source gas (e.g., through a vacuum and/or purge gas), the substrate is exposed to the oxygen source gas, without any silicon source present. However, the order of exposure to the source gases can be altered such that the substrate is first exposed to the oxygen source, without any silicon source present, followed by the silicon source without any oxygen source present. In typical embodiments, the RF power of the PECVD chamber during the deposition process is from about 5 W to about 300 W.

In each DOD cycle, a silicon source and an oxygen source are each individually and sequentially applied to the substrate. Together, these individual applications form a thin layer of silicon dioxide on the surface of the substrate. The amount of silicon and oxygen applied per cycle can be controlled in a variety of ways in a conventional PECVD chamber, including but not limited to, the composition of the source gas, the concentration of the source gas, the length of exposure for each pulse of source gas, the total flow of the source gas per pus as regulated by a mass flow controller, and the temperature of the source gas and/or substrate.

In an alternate embodiment of the current invention, the silicon source gas and the oxygen or nitrogen source gas are not applied sequentially and independently, but are applied with overlapping pulses such that the oxygen or nitrogen source are pulsed while the silicon source is either continuously injected into the deposition chamber or is pulsed such that an overlap in time exists between the silicon and oxygen or nitrogen pulse. In this particular embodiment, there exists in each DOD or DND cycle some time by which the silicon source is injected into the deposition chamber when the oxygen or nitrogen source are not injected into the deposition chamber to facilitate the surface mobility of the silicon source gas that is referred to in the previous embodiment.

The resulting thickness of each cycle of alternating silicon source and oxygen source typically results in a deposition layer having a thickness of less than about 5 nanometers, such as from about 0.5 to about 3 nm, and in some embodiments, between about 1 to about 2 nanometers, such as from about 1 to about 1.5 nanometers. Thus, the thickness of the entire deposition layer can be controlled by the number of cycles performed. As a result, any desired thickness of the deposition layer can be achieved by regulating the number of cycles performed on the substrate. For example, when forming memory devices, such as DRAMs, the thickness of the final dielectric layer is typically between about 2 to about 30 nanometers, and in some embodiments, between about 5 to about 10 nanometers.

The source gases are applied to the substrate in a chamber at a controlled temperature. Controlling the temperature of the chamber can allow control of the amount and thickness of each deposited layer. Typically, the temperature range of the chamber ranges from about 65° C. to about 350° C., such as from about 150° C. to about 325° C. In certain embodiments, the temperature within the chamber can be from about 200° C. to about 300° C., and in some embodiment, from about 225° C. to about 275° C. The temperature on the surface of the substrate generally follows the temperature of the chamber.

The silicon for the dielectric layer can be provided from any suitable silicon source. Typically, in PECVD chambers, the silicon source is provided in gaseous state. Suitable silicon source gases include, without limitation, silane gas ($SiH_4$), disilane ($Si_2H_6$), diethlysilane (DES), tetraethyl-ortho-silicate (TEOS), chlorosilane compounds, or mixtures thereof. Chlorosilane compounds can include, for example, dichlorosilane ($Si_2Cl_2H_2$), hexachlorosilane ($Si_2Cl_6$), silicon tetrachloride ($SiCl_4$), chlorosilane ($SiClH_3$), trichlorosilane ($SiCl_3H$), or combinations thereof. In addition to the silicon source, the silicon source gas can include other, non-oxidizing additives. For example, a reducing agent can be included in the silicon source gas. Reducing agents can facilitate the deposition of silicon on the surface of the substrate. Common reducing agents include, but are not limited to, hydrogen ($H_2$) gas, nitrogen ($N_2$), and inert gases such as helium (He) and argon (Ar). Alternatively, the silicon source gas can be composed only of (or essentially only of) the silicon source.

Likewise, the oxygen for the dielectric layer can be provided from any suitable oxygen source. Typically, in chambers, the oxygen source is provided in gaseous state. Suitable oxygen source gases include, without limitation, oxygen gas ($O_2$), nitrous oxide ($N_2O$), ozone ($O_3$), water vapor ($H_2O$), or mixtures thereof. In some embodiments, the oxygen source gas can be composed only of (or essentially only of) the oxygen source. Alternatively, the oxygen source gas can also include reducing agents (e.g., $H_2$ and $N_2$) and/or inert gases (e.g., He and Ar).

Additionally, the amount of silicon and oxygen applied in each cycle can be controlled by the length of exposure of the source gases to the substrate. In each cycle, the silicon source gas and the oxygen source gas can be alternatively and independently exposed to the substrate for up to about a minute (i.e., 60 seconds). However, in most embodiments, a shorted period is all that will be required to produce a dielectric layer having a sufficient thickness. For example, the source gas can be exposed to the surface of the substrate for up to about 30 seconds, from about 0.1 seconds to about 10 seconds. In some particular embodiments, the pulse period for each source gas ranges from about 0.5 seconds to about 5 seconds, such as from about 1 second to about 3 seconds.

In one embodiment, the respective pulses of the silicon source and the oxygen source can be controlled via a computerized system (i.e., digitally). As such, the amount of respective source gases applied to the substrate can be more precisely controlled, leading to greater control of the thickness of the resulting silicon dioxide layer(s).

No matter the amount or composition of the oxygen source gas applied to the substrate, the oxygen source is allowed to react with the silicon present on the surface of the substrate. Through this oxidation, the silicon deposited on the surface reacts with the oxygen source gas to form silicon dioxide. As stated, this layer of silicon dioxide formed from at least one cycle of alternating silicon and oxygen sources applied to the substrate, forms a dielectric layer on the substrate.

Although the present invention is disclosed with reference to silicon dioxide, it should be understood that the reaction stoichiometry may be varied. As such, the dielectric layer may be formed from a silicon oxide material having the structure $Si_xO_y$, where x is an integer that is at least one (such as from 1 to 5) and y is a number from about 0.5 to about 6, such as from about 1 to about 5. Thus, the resulting dielectric layer may include other silicon oxide materials that vary in stoichiometry from $SiO_2$, but have similar properties.

In one embodiment, a nitrogen source can be substituted for or added to the oxygen source. Thus, the resulting dielectric layer can include silicon nitride molecules, such as $SiN_2$ or a stiochiometric variance thereof. For example, the silicon nitride can have the formula $Si_uN_v$, where $1<u\leq5$ and $2\leq v\leq8$. Thus, the dielectric layer can include either silicon oxide or silicon nitride molecules, or a combination of the two. For example, silicon oxynitride is also a suitable dielectric material.

In one particular embodiment, the substrate can be a HFET, including but not limited to, insulated gate HFETs (IGH-FETs) and metal oxide semiconductor heterojunction field effect transistors (MOSHFETs). In one embodiment, the HFET can be a III-Nitride based HFET. Suitable HFETs are disclosed in U.S. Pat. Nos. 6,690,042 and 6,764,888 both issued to Khan, et al. on Feb. 10, 2004 and Jul. 20, 2004, respectively, the disclosures of which are herein incorporated by reference in their entirety.

Although the present DOD technique is generally described in reference to HFETs, the DOD technique can be used on any of a variety of substrates that includes a dielectric layer. For example, the substrate can be any field effect transistor (e.g., insulated gate field effect transistors, metal oxide semiconductor field effect transistors, and the like. Likewise, the DOD technique can be utilized to for dielectric layers on other semiconductor devices, including but not limited to, transistors, capacitors, light emitting diodes, laser diodes, acoustic devices (e.g., surface acoustic wave devices), photodetectors, etc.

EXAMPLES $SiO_2$ gate dielectric layers with thickness ranging from 8 nm to 16 nm were deposited over AlGaN/GaN heterostructures. The depositions were carried out at a temperature range of 250° C. For comparison, similar $SiO_2$ layers with the same thicknesses were also deposited using conventional PECVD technique keeping the same process conditions except that the flow of precursor was continuous and simultaneous.

Figure 2:
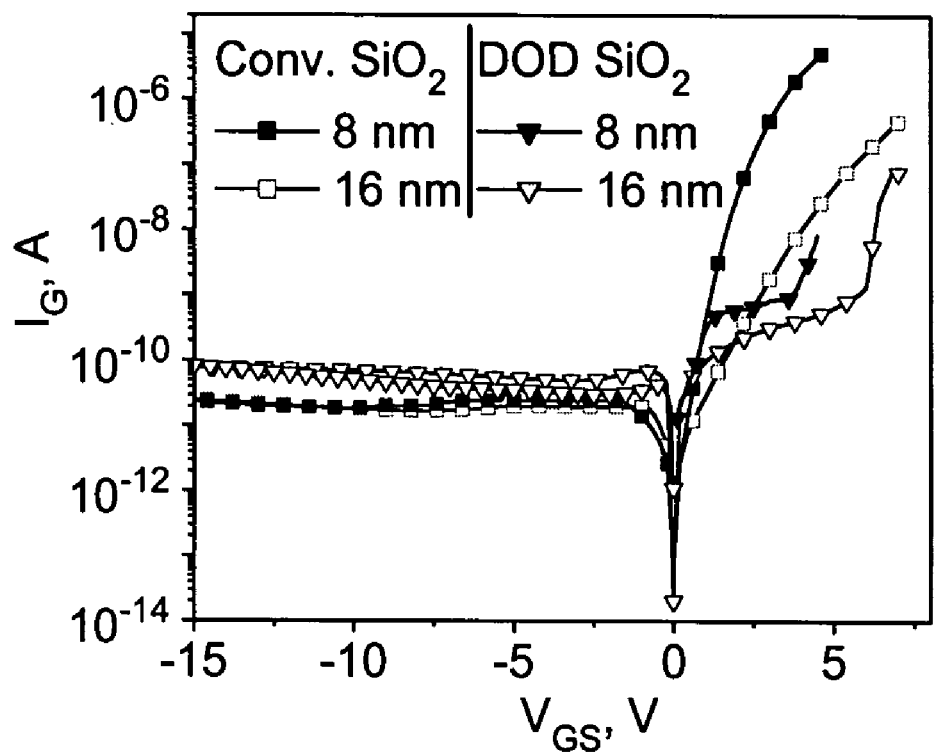
FIG. 2 shows gate leakage characteristics of MOSHFETs using conventional and DOD SiO$_2$ layers.

The quality of the DOD and the conventional dielectric layers was characterized using an atomic force microscope (AFM): As shown in FIGS. 1a and 1b, the root mean square (rms) roughness for 8 nm silicon dioxide layers decreased by approximately a factor of three from about 0.62 nm for conventional silicon dioxide to about 0.24 nm for DOD silicon dioxide. This rms roughness for the DOD layers does not appreciably change for the thicknesses range from 8 nm to 16 nm. However for conventional PECVD films the rms value decreased to 0.41 nm from 0.62 nm when the thickness was increased to 16 nm from 8 nm. The improvement in the film rms roughness resulted in significant reduction of the forward gate leakage currents as indicated in FIG. 2. It is clearly seen that even for the 16 nm conventional PECVD films, the forward gate leakage for IGHFET was higher than that for the device with a 8 nm thick DOD layer. Since the forward gate currents play a key role in determining the stability of the III-N HFETs at the maximum rf powers, the IGHFETs with DOD layers should have a superior stability. Metal-oxide-semiconductor heterostructure field effect transistors (MOSHFETs) with 8 nm thick DOD $SiO_2$ layers under the gate had threshold voltage of 6.0 V, which is only 1.0 V larger than that of the Schottky gate HFET fabricated from the same wafer. The transfer characteristics of these low-threshold MOSHFETs and a conventional HFET (from same wafer) are compared in FIG. 3a.

Figure 3:
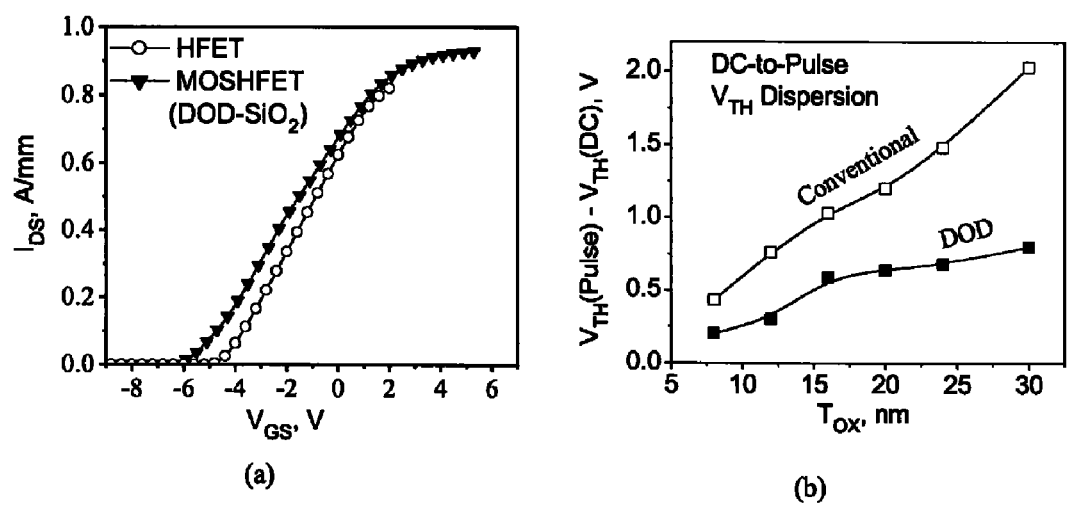
FIG. 3 shows DC transfer characteristics of MOSHFETs using (a) conventional and DOD SiO$_2$ layers and (b) DC-to-Pulse Dispersion of V$_{TH}$ for conventional and DOD MOSHFETs.

The threshold voltage dispersion induced by the interface and the bulk charges in the gate insulator $SiO_2$ films were then studied by comparing the DC and pulse transfer characteristics of the conventional MOSHFETs and DOD MOSHFETs. Device width and the gate length were 100 µm 1.2 µm respectively. For pulse measurements, the Dynamic I-V Analyzer (DiVa) by Accent Optical Technologies, Inc. was used. The devices were pulsed from the unbiased condition ($V_D=V_G=0$) with a pulse width of 0.2 µs. The threshold voltage obtained from pulse measurements was compared to that for DC biasing at 10 V drain bias. The difference between DC and pulsed threshold voltages was used as a measure for the threshold voltage dispersion. In FIG. 3b, we show the threshold voltage dispersion as a function of thickness of the gate dielectric layer. For conventional PECVD $SiO_2$ films, the difference between the pulse and DC threshold voltages was found to linearly increase with the dielectric thickness. This observation suggests that the dispersion is primarily caused by the bulk charges in the $SiO_2$ layer rather than by the interface charges (at the $SiO_2$/AlGaN interface). For the DOD films, the dispersion is much lower as compared to conventional dielectric indicating a significantly lower concentration of the bulk charges and hence the interface charges may be the dominating contribution. No threshold dispersion was observed for the HFETs.

The RF performance of low-threshold MOSHFETs with DOD dielectric films was then studied on filed-plated devices fabricated as described in reference. The RF powers were measured at 2 GHz using a Maury automated tuning system. The device used for this measurement had a total width of 200 µm and a gate length of 1.2 µm. The RF powers at 3 dB gain compression point exhibit linear drain bias dependence. At 55 V drain bias, the output power of 15 W/mm was measured closely corresponding to the powers expected from the device DC I-V characteristics. This is indicative of a nearly current collapse free operation.

Figure 4:
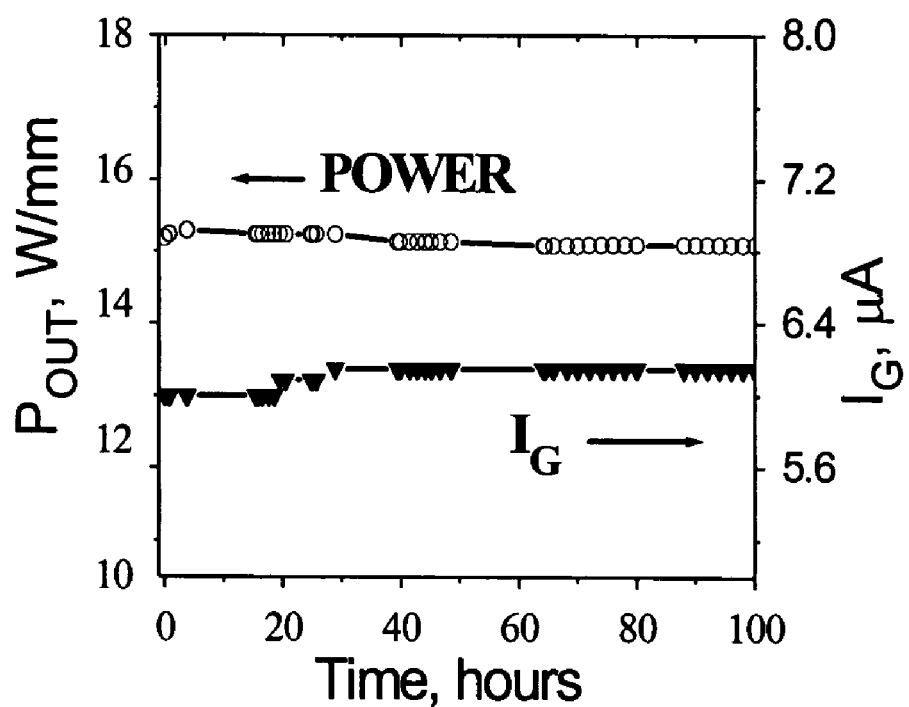
FIG. 4 shows RF Power stability of the MOSHFET with DOD-SiO$_2$.

The RF stability tests were then performed on wafer at 2 GHz. The testing was carried out at room temperature without any cooling of probe station chuck. Before the rf stress, the devices were tuned for input and output impedance matching. After tuning, the drain bias of 55 V and the input power of 24 dBm were applied to reach the output power level corresponding to a 3 dB gain compression. The time dependency of the output powers for the DOD MOSHFET under the RF stress is shown in FIG. 4. As seen the output power remained remarkably constant during the stress showing no appreciable drop for up to 100 hours of CW operation when the test was stopped.

In conclusion, using a novel digital oxide deposition (DOD) technique, we were able to obtain very high quality silicon dioxide layers even with thicknesses as small as 8 nm. Using these layers for the gate dielectric, low threshold voltage MOSHFETs with very low gate-leakage currents and voltage dispersion were fabricated. These MOSHFET devices delivered RF powers as high as 15 W/mm at 55 V drain bias. No RF power degradation was observed during a 100 hours stress at a power level of 15 W/mm.

The invention claimed is:
1. A method of depositing a dielectric layer on a substrate, the method comprising:
   introducing a substrate into a plasma enhanced chemical vapor deposition chamber, wherein the substrate defines a surface, wherein the temperature of the substrate is between about 65° C. and about 350° C.;
   forming a plasma within the plasma enhanced chemical vapor deposition chamber;
   introducing a silicon source into the plasma enhanced chemical vapor deposition chamber such that the silicon deposits on the surface of the substrate, wherein the silicon source is substantially free from an oxidizing agent;

independent from the silicon source, introducing an oxygen source, a nitrogen source, or a combination thereof into the plasma enhanced chemical vapor deposition chamber, wherein the oxygen source and/or nitrogen source is substantially free from a silicon source, wherein a dielectric layer including silicon oxide and/or silicon nitride is formed on the surface of the substrate.

2. The method as in claim 1, wherein the temperature of the substrate is between about 200° C. and about 300° C.

3. The method as in claim 1, wherein the dielectric layer includes silicon oxide formed from exposing the surface of the substrate to an oxygen source, wherein the silicon oxide has a structure of $Si_xO_y$, where x is an integer that is at least one and y is a number from about 0.5 to about 5.

4. The method as in claim 3, wherein the silicon oxide comprises silicon dioxide.

5. The method as in claim 3, wherein the silicon source comprises silane, disilane, diethlysilane, tetraethyl-ortho-silicate, chlorosilane compounds, or mixtures thereof.

6. The method as in claim 1, wherein the oxygen source comprises oxygen, ozone, nitrous oxide, or mixtures thereof.

7. The method as in claim 1, wherein the substrate comprises a field effect transistor.

8. The method as in claim 7, wherein the substrate comprises a heterojunction field effect transistor.

9. The method as in claim 8, wherein the heterojunction field effect transistor is III-nitride based.

10. The method as in claim 1, wherein the plasma enhanced chemical vapor deposition growth chamber has a RF power of between about 10 W and about 300 W.

11. The method as in claim 10, wherein the surface of the substrate is exposed to the silicon source for a period of from about 0.5 seconds to about 1 minute.

12. The method as in claim 10, wherein the surface of the substrate is exposed to the oxygen source and/or nitrogen source for a period of from about 0.5 seconds to about 1 minute.

13. The method as in claim 1, wherein the dielectric layer includes silicon nitride formed from exposing the surface of the substrate to a nitrogen source.

14. A silicon oxide deposition method comprising:
introducing a substrate defining a surface within a plasma enhanced chemical vapor deposition growth chamber having a temperature of between about 65° C. and about 350° C.;
forming a plasma within the plasma enhanced chemical vapor deposition chamber;
exposing the surface to a silicon source gas for about 0.1 seconds to about 1 minute, wherein the silicon source gas is substantially free from an oxidizing agent;
thereafter, exposing the surface to an oxygen source gas for about 0.1 seconds to about 1 minute, wherein the oxygen source gas is substantially free from a silicon source; and
wherein the silicon source and the oxygen source combine to form a silicon oxide layer having a thickness of from about 0.5 nanometers to about 5 nanometers on the surface of the substrate.

15. The silicon oxide deposition method as in claim 14, wherein the temperature of the substrate is between about 200° C. and 300° C.

16. The silicon oxide deposition method as in claim 14, wherein the temperature of the substrate is between about 225° C. and 275° C.

17. The silicon oxide deposition method as in claim 14, wherein the silicon source comprises silane, disilane, diethlysilane, tetraethyl-ortho-silicate, chlorosilane compounds, or mixtures thereof.

18. The silicon oxide deposition method as in claim 14, wherein the oxygen source comprises oxygen gas, ozone gas, nitrous oxide, or mixtures thereof.

19. The silicon oxide deposition method as in claim 14, wherein the silicon oxide has a structure of $Si_xO_y$, where x is an integer that is at least one and y is a number from about 0.5 to about 5.

20. The silicon oxide deposition method as in claim 14, wherein the silicon oxide comprises silicon dioxide.

21. A silicon dioxide deposition method comprising:
introducing a substrate defining a surface within a plasma enhanced chemical vapor deposition growth chamber, wherein temperature of the substrate is between about 65° C. and about 350° C.;
forming a plasma within the plasma enhanced chemical vapor deposition chamber;
exposing the surface to a silicon source gas, wherein the silicon source gas comprises silane gas and is substantially free from an oxidizing agent;
thereafter, exposing the surface to an oxygen source gas, wherein the oxygen source gas comprises oxygen gas and is substantially free from a silicon source; and
wherein the silicon source and the oxygen source combine to form a silicon oxide layer on the surface of the substrate.

22. The silicon dioxide deposition method as in claim 21, wherein the silicon source gas consists essentially of silane gas.

23. The silicon dioxide deposition method as in claim 21, wherein the silicon source gas consists essentially of oxygen gas.

24. A silicon nitride deposition method comprising:
introducing a substrate defining a surface within a plasma enhanced chemical vapor deposition growth chamber, wherein temperature of the substrate is between about 65° C. and about 350° C.;
forming a plasma within the plasma enhanced chemical vapor deposition chamber;
exposing the surface to a silicon source, wherein the silicon source is substantially free from an oxidizing agent;
exposing the surface to an nitrogen source, wherein the nitrogen source is substantially free from a silicon source; and
wherein the silicon source and the nitrogen source combine to form a silicon nitride layer on the surface of the substrate.

25. The silicon nitride deposition method as in claim 24, wherein the silicon nitride layer comprises silicon nitride having the formula $Si_uN_v$, where $1<u<5$ and $2<v<8$.

26. The silicon nitride deposition method as in claim 24, wherein the nitrogen source comprises ammonia, nitrogen gas, or mixtures thereof.

* * * * *